United States Patent [19]

Jakob et al.

[11] 4,196,467

[45] Apr. 1, 1980

[54] ELECTRONIC SYSTEM HOUSING STRUCTURE, PARTICULARLY FOR AUTOMOTIVE ENVIRONMENTS

[75] Inventors: Gert Jakob, Stuttgart; Hans-H. Maue, Asperg, both of Fed. Rep. of Germany

[73] Assignee: Robert Bosch GmbH, Stuttgart, Fed. Rep. of Germany

[21] Appl. No.: 873,375

[22] Filed: Jan. 30, 1978

[30] Foreign Application Priority Data

Mar. 26, 1977 [DE] Fed. Rep. of Germany ....... 7709621

[51] Int. Cl.² .............................................. H05K 5/00
[52] U.S. Cl. ................................... 361/399; 174/52 S
[58] Field of Search ............ 361/395, 399; 174/52 R, 174/52 S; 188/1 B; 206/334; 248/632, 634

[56] References Cited

U.S. PATENT DOCUMENTS

| 3,539,874 | 11/1970 | Swanson | 174/52 R |
| 3,829,604 | 8/1974 | Tanaka | 361/399 |
| 3,904,812 | 9/1975 | Deffron | 361/395 |
| 4,015,549 | 9/1977 | Fiege | 361/399 |
| 4,047,242 | 9/1977 | Jakob et al. | 361/399 |

Primary Examiner—David Smith, Jr.
Attorney, Agent, or Firm—Frishauf, Holtz, Goodman & Woodward

[57] ABSTRACT

To provide for shock and vibration resistance and ease of assembly, a housing is formed with an access opening closed off by a cover. A support plate, such as a printed circuit board for electronic components is inserted in the housing, and a resilient, springy cushioning body is interposed between the support plate and the inner wall of the housing, the opening of the housing being closed off by a cover plate through which attachment prongs project. The resilient springy body is preferably hydrophobic, and of closed cellular construction so that it will not act like a sponge but reject absorption of moisture.

9 Claims, 1 Drawing Figure

U.S. Patent
Apr. 1, 1980
4,196,467
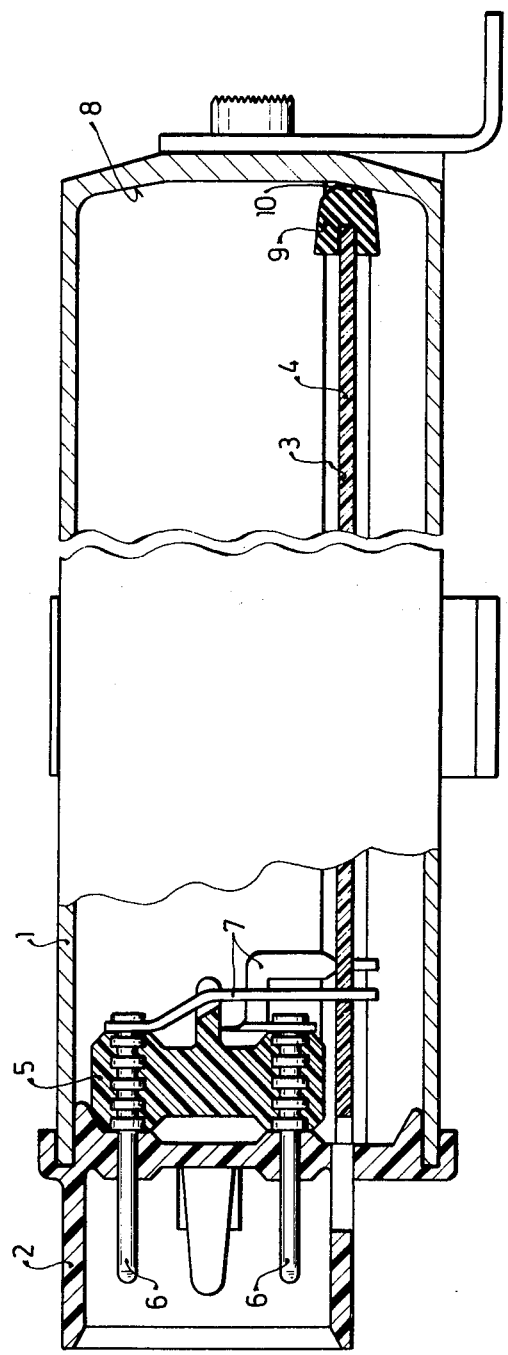

ELECTRONIC SYSTEM HOUSING STRUCTURE, PARTICULARLY FOR AUTOMOTIVE ENVIRONMENTS

Cross Reference to related patent and applications, assigned to the assignee of the present application U.S. Pat. No. 4,047,242, Jakob et al. U.S. appl. Ser. No. 865,581 filed Dec. 29, 1977, Gansert et al, now abandoned, German Priority P No. 27 02 173.4.

The present invention relates to a housing structure for electronic components and more particularly to a housing structure which is adepted for assembly with, or on automotive vehicles.

BACKGROUND AND PRIOR ART

Electronic circuit components, and electronic systems assemblies, such as electronic speed control, ignition systems, ignition control systems, gear changing control systems and the like require electronic circuits which use components usually mounted on a support plate, such as a printed circuit board, which, in turn, is located in the housing. The unfavorable environmental conditions under which automotive vehicles must operate, that is, extremes of temperature, humidity, and presence of potentially corrosive liquids, such as diluted brine solutions, while being subjected to shocks and vibration, require housing structures and mounting arrangements which protect the electronic components against these outside influences. Additionally, the control system should be easily assembled in its housing. Damping shocks or vibration by utilizing a rubber plate or the like has been previously proposed. Introducing damping elements such as rubber discs, or rubber plates into such a housing structure holding electronic components causes manufacturing, and assembly difficulties however. If the housing is in the form of a deep drawn cup with a cover plate closing off the top then it is difficult to mount support plates in such a housing structure under mass production conditions.

THE INVENTION

It is an object to provide a housing structure for an electronic system, particularly for use in automotive environments, which is simple to manufacture, sturdy and reliable and will not introduce assembly difficulties when assembling the electronic circuitry into the housing.

Briefly, the housing is deep drawn, that is, is cup shaped and is formed with a cover closing off an opening thereof. The support plate extends into the housing from the cover towards the opposite wall thereof. To provide for shock mounting of the support plate, and resilient engagement of the support plate with the housing, a hydrophobic resilient springy body is interposed between the support plate and the wall of the housing remote from the cover opening, which, when the cover closes off the opening, resiliently compresses to hold the support plate resiliently against the cover while positioning the support plate in the housing. The hydrophobic resilient spring body, preferably, is a rubbery substance cellular structure formed of closed cells so that it will not have the tendency to act like a sponge, that is, will reject moisture or humidity, thus not becoming saturated or waterlogged. This provides for long life of the unit. In a preferred form, the body is a strip having general U-shape in cross section, clipped around a printed circuit board forming the support plate, the bend of the U bearing against the inner wall of the housing, and the legs of the U engaging around the support plate, thus additionally facilitating assembly.

The springy element can thus be secured to the printed circuit board, or other support plate before being introduced or assembled into the housing. This greatly facilitates manufacture and permits assembly of the springy element to the printed circuit board when plenty of working space is available.

In the preferred form of the invention, the springy body is a strip of U-shaped cross section of cellular rubber. It can readily be clamped on the edge of a printed circuit board. The bend of the U, which may be thickend or reinforced, simultaneously can accomodate manufacturing inaccuracies and tolerances between the inner wall of the housing and the printed circuit board, while additionally pressing the other end of the printed circuit board, or a terminal block attached thereto against the inner wall of the housing cover. Thus, the printed circuit board and a terminal block which may be secured thereto is reliably seated in the housing, held therein resiliently, thus preventing loosening and rattles.

DRAWING, ILLUSTRATING AN EXAMPLE

The single FIGURE is a schematic longitudinal sectional view through an electronic system held in the housing structure.

A deep-shaped housing 1, generally of cup shape, is closed off at its opening with a cover 2. The interior of the housing is formed with guide grooves 3 to receive a printed circuit board 4 pushed therebetween. The printed circuit board 4 carries printed circuits and electrical or electronic components, collectively referred to as circuit elements. A terminal block 5 is secured to the printed circuit board, for example, by rivets (not shown).

The terminal block holds a plurality of attachment prongs or pins 6. The interior portions of the pin 6 are formed as attachment pins 7 which are soldered to suitable connecting paths, or connections formed on the printed circuit board 4. The edge of the printed circuit board 4 opposite that facing the cover 2 is seated against the inner wall 8 of the housing 1 by means of an intermediate connecting body 9. The connecting body 9 is a cellular rubber strip of generally U-shaped cross section, so that it can be pushed over the edge of the printed circuit board 4, as is readily apparent from the FIGURE, before the printed circuit board 4 is assembled into the housing 1. Thus, assembly of the body 9 to the printed circuit board 4 is simple, and subsequent assembly of the combination of printed circuit board 4 and springy body 1 into the housing merely involves pushing the sub-assembly into the housing between the grooves 3.

The cellular rubber strip 9 forms a springy, resilient element between the printed circuit board 4 and the inner wall 8 of the housing 1 to reliably and securely hold printed circuit board 4 within the housing 1. The back 10 of the body 9, which can be substantially thicker than the leg portions thereof, as clearly apparent in the FIGURE, presses board 4, due to its resiliency, in the direction of the cover 2. The terminal block 5, which slightly projects forwardly from the board 4, as seen in the FIGURE, is thus pressed against the inside the cover 2, thus securing both the board 4 as well as the terminal block 5 within the housing 1 without vibration, shaking, or rattles.

The housing 1 may have substantial length with respect to its height or width. Manufacturing inaccuracies are taken up by the springy body 9, compensating for inaccuracies or tolerances between the length of the housing 1 and the board 4. The cellular rubber strip 9 is particularly suitable as a cushion due to its high relaxation force. Even compression of up to 50% of its "loose shape", and for a long period of time will not cause permanent deformation, but will retain the springiness. Cellular rubber, due to its closed pores, does not act like a sponge. Thus, a spot where moisture may collect and thus cause corrosion or deterioation of the board 4 is eliminated. There is always danger of the formation of corrosion, or possible short circuits in the vacinity of the junction between the board 4 and the housing. Using the generally hydrophobic cellular structure for the body 9 substantially reduces the danger of corrosion, short circuit, or deterioration of the board 4 in the vicinity of the body 9. The construction permits use of simple housing covers 2 without elaborate seals, for example, assembly of the housing 1 into a groove formed in the cover 2 and retention therein by an adhesive, or by plastic welding.

The structures can be used for many types of electronic devices which are to be placed in a hostile environment, while being subjected to shock or vibration. They are particularly suitable for automotive applications, for example, for various types of control systems applied to automotive vehicles.

Various changes and modifications may be made within the scope of the inventive concept.

We claim:

1. Electronic system housing structure, particularly for use in automotive environments having a cup-shaped housing (1) having an access opening therein;

a cover (2) closing off said opening;

a support plate (4) to support electrical circuit elements thereon located in the housing and extending transversely thereof from an inner wall of the housing (8) towards the opening;

terminal block means (5) including contact prongs (6) secured thereto, the contact prongs each having an inner end electrically connected to at least some of the circuit elements on the support plate and having an outer end extending through the cover plate (2);

and means resiliently mounting said support plate in the housing comprising, in accordance with the invention, a hydrophobic resilient springy body (9) retained on the support plate and interposed between the support plate and the inner wall (8) of the housing remote from said cover (2) which closes off the opening, and resiliently pressing the support plate (4) towards the cover (2) while positioning the support plate (4) in the housing (1) of generally U-shaped cross section, the support plate (4) being retained between the legs of the U, and the back, or bend (10) of the U-shaped body resiliently engaging the inner wall (8) of the housing.

2. Structure according to claim 1, wherein the hydrophobic resilient springy body (9) comprises a cellular rubber element.

3. Structure according to claim 2, wherein the cellular rubber element is a strip of cellular rubber.

4. Structure according to claim 1, wherein the spring body is a cellular rubber body (9) in strip form, the legs of the U engaging around and being clamped over the sides of the support plate (4).

5. Structure according to claim 1, wherein the thickness of the back, or bend portion of the U is large with respect to the thickness of the legs of the U, to provide for a thickened back portion of the U and an extended compression zone of said body.

6. Structure according to claim 5, wherein the spring body is a cellular rubber body (9) in strip form, the legs of the U engaging around and being clamped over the sides of the support plate (4).

7. Sealed, elongated automotive electronic system protective housing
comprising the structure of claim 1
wherein the housing is a closed, elongated tubular element formed with an opening at an axial end thereof, and the cover (2) is positioned against said opening and sealed to the housing.

8. Sealed, elongated automotive electronic system protective housing
comprising the structure of claim 4
wherein the housing is a closed, elongated tubular element formed with an opening at an axial end thereof, and the cover (2) is positioned against said opening and sealed to the housing.

9. Housing according to claim 8, wherein the thickness of the back, or bend portion of the U is large with respect to the thickness of the legs of the U, to provide for a thickened back portion of the U and an extended compression zone of said body.

* * * * *